United States Patent
Cavallini et al.

(10) Patent No.: US 9,037,438 B2
(45) Date of Patent: May 19, 2015

(54) DEVICE AND METHOD FOR DETECTING AND PROCESSING SIGNALS RELATING TO PARTIAL ELECTRICAL DISCHARGES

(75) Inventors: Andrea Cavallini, Casalecchio di Reno (IT); Davide Fabiani, Bologna (IT); Gian Carlo Montanari, Zola Predosa (IT)

(73) Assignee: TECHIMP HQ S.R.L., Zola Predosa (IT)

( * ) Notice: Subject to any disclaimer, the term of this patent is extended or adjusted under 35 U.S.C. 154(b) by 410 days.

(21) Appl. No.: 13/503,949

(22) PCT Filed: Oct. 29, 2010

(86) PCT No.: PCT/IB2010/054904
§ 371 (c)(1),
(2), (4) Date: Apr. 25, 2012

(87) PCT Pub. No.: WO2011/051910
PCT Pub. Date: May 5, 2011

(65) Prior Publication Data
US 2012/0209572 A1    Aug. 16, 2012

(30) Foreign Application Priority Data

Oct. 30, 2009  (IT) .............................. BO2009A0712

(51) Int. Cl.
*G06F 15/00* (2006.01)
*G01R 31/14* (2006.01)
(Continued)

(52) U.S. Cl.
CPC .............. *G01R 31/14* (2013.01); *G01R 15/142* (2013.01); *G01R 31/12* (2013.01)

(58) Field of Classification Search
CPC ...... G01R 15/142; G01R 31/12; G01R 31/14; G01R 19/2513; G01R 31/1227
USPC .......... 702/58, 59, 60, 64, 65, 66, 70, 72, 73, 702/189, 190; 324/649
See application file for complete search history.

(56) References Cited

U.S. PATENT DOCUMENTS 5,214,595 A    5/1993    Ozawa et al.
8,055,459 B2    11/2011    Montanari et al.
(Continued)

FOREIGN PATENT DOCUMENTS

CN         1782724 A      6/2006
JP      2008022624 A      1/2008
(Continued)

OTHER PUBLICATIONS

Tozzi, et al., "Off-Line and On-Line PD Measurements on Induction Motors Fed by Power Electronic Impulses", Electrical Insulation Conference, 2009, EIC 2009, IEEE, IEEE, Piscataway, NJ, USA, May 31, 2009, pp. 420-424.

(Continued)

*Primary Examiner* — John H Le
(74) *Attorney, Agent, or Firm* — Pearne & Gordon LLP

(57) ABSTRACT

A device (1) for detecting and processing signals relating to partial electrical discharges in an electrical apparatus (2) powered by a square-wave (3) voltage modulated by a modulating wave (4) in such a way as to form an alternating voltage of predetermined frequency, comprises: a sensor (5) connectable to the apparatus (2) for detecting a discharge signal (6) representing the electrical pulses generated by the partial discharges; a processing unit (7) connected to the sensor (5) to receive the discharge signal (6) and derive the detection instants of each of the pulses detected with respect to a predetermined time reference, a synchronization module (8) designed to receive an electrical signal (9) representing the power supply voltage and equipped with a filter (10) configured for extracting from said power supply signal (9) a signal (11) representing the modulating wave (4), the processing unit (7) being configured for associating with the pulses detected the values of a phase parameter (f) representing the phase of the modulating wave (4) at the pulse detection instants.

10 Claims, 2 Drawing Sheets

(51) Int. Cl.
  *G01R 31/12* (2006.01)
  *G01R 15/14* (2006.01)

(56) References Cited

U.S. PATENT DOCUMENTS

| | | | |
|---|---|---|---|
| 8,126,664 | B2 | 2/2012 | Fournier et al. |
| 8,467,982 | B2* | 6/2013 | Serra et al. .................. 702/59 |
| 2009/0177420 | A1 | 7/2009 | Fournier et al. |
| 2009/0248327 | A1 | 10/2009 | Montanari et al. |
| 2012/0319703 | A1* | 12/2012 | Serra et al. .................. 324/649 |

FOREIGN PATENT DOCUMENTS

| | | |
|---|---|---|
| JP | 2008045977 A | 2/2008 |
| WO | 2006122415 A1 | 11/2006 |
| WO | 2007144789 A2 | 12/2007 |

OTHER PUBLICATIONS

Fabiani, et al., "A UHF Technique for Advanced PD Measurements on Inverter-Fed Motors", IEEE Transactions on Power Electronics, IEEE Service Center, Piscataway, NJ, USA, Sep. 1, 2008, vol. 23, No. 5, pp. 2546-2556.

Luo, et al., "Phase Distribution Characteristics of Partial Discharge Under Square Pulse Voltage", Properties and Applications of Dielectric Materials, 2009. ICPADM 2009. IEEE 9th International Conference on the, IEEE, Piscataway, NJ, USA, Jul. 19, 2009, pp. 542-545.

Cheng-Chi Tai, et al., "A Simple Partial Discharge Detector for Low-Voltage Rotating Electrical Machines", Power Electronics, 2007. ICPE '07. 7th International Conference on, IEEE, Piscataway, NJ, USA, Oct. 22, 2007, pp. 310-315.

Cristaldi, et al., "An Inverter-Fed Induction Motor Diagnostic Tool Based on Time-Domain Current Analysis", IEEE Transactions on Instrumentation and Measurement, IEEE Service Center, Piscataway, NJ, USA, May 1, 2009, vol. 58, No. 5, pp. 1454-1461.

Okubo, et al., "Technical Development on Partial Discharge Measurement and Electrical Insulation Techniques for Low Voltage Motors Driven by Voltage Inverters", IEEE Transactions on Dielectrics and Electrical Insulation, IEEE Service Center, Piscataway, NJ, USA, Dec. 1, 2007, vol. 14, No. 6, pp. 1516-1530.

Cavallini, et al., "A Novel Method to Diagnose PWM-FED Induction Motors", IEEE Transactions on Dielectrics and Electrical Insulation, IEEE Service Center, Piscataway, NJ, USA, Oct. 1, 2008, vol. 15, No. 5, pp. 1313-1321.

Tang Zhi-guo et al., "Pulse Interferences Elimination and Classification of On-line UHF PD Signals", High Voltage Engineering, vol. 35, No. 5, May 31, 2009, pp. 1026-1031.

* cited by examiner

DEVICE AND METHOD FOR DETECTING AND PROCESSING SIGNALS RELATING TO PARTIAL ELECTRICAL DISCHARGES

TECHNICAL FIELD

This invention relates to a device and a method for detecting and processing signals relating to partial electrical discharges.

More specifically, the invention regards a device and a method for detecting and processing signals relating to partial electrical discharges in an electrical apparatus powered by a pulsed voltage, in particular, a square-wave voltage, modulated by a modulating wave in such a way as to form an alternating voltage of predetermined frequency.

BACKGROUND ART

It should be noted that a partial electric discharge (normally known as partial discharge) is an electric discharge limited to a portion of the insulation of an electrical system and does not therefore cause immediate failure of the system but its gradual degradation. By their very nature, therefore, partial discharges are substantially limited in extent to a defect in the insulating system. In light of this, diagnostic methods based on the detection and interpretation of partial discharges make it possible to investigate the nature of defects in the insulating system where the discharges occur.

Thus, detection and analysis of partial discharges has huge potential as a diagnostic tool for assessing the conditions of electrical insulation of electrical apparatus.

This is especially true when the electrical apparatus is powered by alternating voltage which facilitates the generation and recurrence of partial discharges.

To be able to analyse the measurements of partial discharges for diagnostic purposes, the procedure is as follows:
- a sequential group of partial discharge pulses is acquired (the number of pulses must be significant in statistical terms);
- for each pulse (that is, electrical signal) detected, suitable quantities (that is, suitable parameters) are derived to obtain a data set relating to that acquisition;
- the data set is then statistically processed to derive diagnostic indicators whose values are representative of (that is, correlated to) the condition of the electrical insulation where the partial discharges acquired occur.

Normally, two parameters are derived from the pulses detected. These are the following: an amplitude parameter (consisting of the amplitude of the electrical pulses generated by the partial discharges and hence correlated with the intensity of the discharges themselves) and a phase parameter (consisting of the phase of the alternating voltage that powers the electrical apparatus at the instant of detection and hence correlated with the intensity of the electric field which generates the partial discharges).

In effect, a sinusoidal alternating voltage has a period of 360 degrees and inverts sign at 180 degrees. Therefore, the value of the phase parameter depends on the value of the voltage applied to the apparatus at the instant of discharge. For example, the fact that the value of the phase parameter is 90 degrees means that the partial discharge occurred when the power supply voltage of the apparatus was positive in sign and its value the highest.

The amplitude parameter is generally detected using sensors which can detect the current pulses generated by the partial discharges propagating along the apparatus.

The phase parameter is derived from a reading of the voltage applied to the apparatus.

As regards the statistical processing of the data set, it has become a standard practice to represent the amplitude and phase parameters in a pattern, known as PRPD pattern (an acronym for Phase Resolved Partial Discharge pattern) with phase parameter on the x-axis and amplitude parameter on the y-axis. The pattern also has a third dimension, relating to the number of pulses (in the context of the group of pulses of the acquisition being processed) having similar values of amplitude and phase parameters.

Thus, in order to detect the signals and extract the parameters, instruments have been developed which are equipped with a sensor connectable to the apparatus to detect a discharge signal representing the discharge pulses generated by the partial discharges, and with a processing unit connected to the sensor for receiving the discharge signal and deriving the detection instants of each of the pulses detected with respect to a predetermined time reference.

Prior art instruments and methods, however, encounter considerable problems when the alternating voltage (sinusoidal) applied to the electrical apparatus is obtained from a square wave subjected to modulation (for example, with a PWM technique).

In effect, in this a situation, the reading of the voltage applied to the electrical apparatus does not make available the phase of that voltage itself.

Thus, if the apparatus is powered by a modulated square wave voltage, the systems are not able to detect, that is, derive, the phase parameter and, consequently, do not allow the phase-amplitude pattern (that is, the PRPD pattern) to be obtained.

This constitutes a serious limitation to the statistical processing of the data acquired and significantly reduces the diagnostic effectiveness of prior art systems when the supply voltage is obtained by modulating a square wave voltage.

AIM OF THE INVENTION

This invention has for an aim to provide a device and a method which can be used to detect and process signals relating to partial electrical discharges in an electrical apparatus powered by a pulsed voltage, that is, a square-wave voltage modulated by a modulating wave in such a way as to form an alternating voltage of predetermined frequency, and which overcome the above mentioned drawbacks of the prior art.

More specifically, the aim of this invention is to provide a device and a method which can be used to detect and process signals relating to partial electrical discharges in an electrical apparatus powered by a pulsed voltage, that is, a square-wave voltage modulated by a modulating wave in such a way as to form an alternating voltage of predetermined frequency and which are particularly effective for diagnostic purposes.

Another aim of this invention is to provide a device and a method which can be used to detect and process signals relating to partial electrical discharges in an electrical apparatus powered by a square-wave voltage modulated by a modulating wave in such a way as to form an alternating voltage of predetermined frequency and which allow use of processing techniques that are robust and particularly effective for diagnostic purposes.

These aims are fully achieved by the device and method and apparatus according to the invention as characterized in the appended claims.

More specifically, the device according to the invention is characterized in that it comprises a synchronization module designed to receive an electrical signal representing the power supply voltage and equipped with a filter configured for extracting from said power supply signal (that is, from said power supply voltage) a signal representing the modulating wave; the processing unit is configured for associating with the pulses detected (i.e. measured) the values of a phase parameter representing the phase of the modulating wave at the pulse detection instants.

The invention therefore makes it possible to obtain the values of the phase parameter for the partial discharge pulses even when the voltage applied to the apparatus is an alternating voltage obtained by modulating a square wave.

Further, the processing unit is programmed to acquire a plurality of pulses detected in sequence and to generate a data set comprising, for each pulse of said plurality, the value of an amplitude parameter correlated to the amplitude of the pulse detected, and the value of the phase parameter. The invention therefore also makes it possible to build the PRPD pattern for the data measured on apparatuses powered by an alternating voltage obtained by modulating a square wave.

The method according to this invention comprises the following steps:
  connecting a sensor to the apparatus for detecting a discharge signal representing the electrical pulses generated by the partial discharges;
  deriving the detection instants of each of the pulses detected with respect to a predetermined time reference;
  extracting the modulating wave from an electrical signal representing the supply voltage;
  associating the pulses detected with values of a phase parameter representing the phase of the modulating wave at the pulse detection instants.

The method thus constitutes a particularly robust diagnostic technique which is based on the processing of partial discharges and which is effective even when the voltage applied to the electrical apparatus tested is an alternating (sinusoidal) voltage obtained by modulating a square wave.

BRIEF DESCRIPTION OF THE DRAWINGS

These and other features of the invention will become more apparent from the following description of a preferred, non-limiting embodiment of it, with reference to the accompanying drawings, in which.

DETAILED DESCRIPTION OF THE PREFERRED EMBODIMENTS OF THE INVENTION

Figure 1:
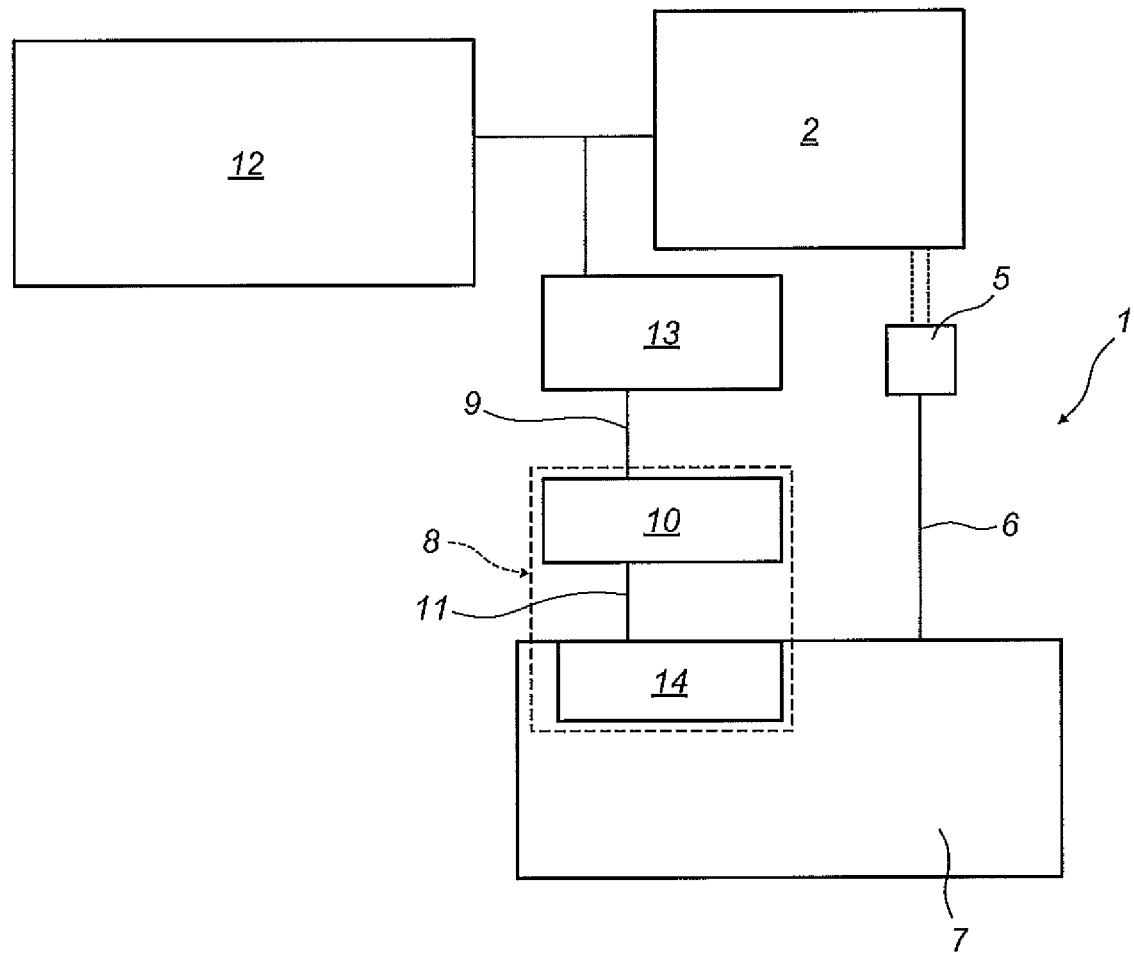
FIG. 1 is a functional diagram of the device according to the invention.
Figure 2:
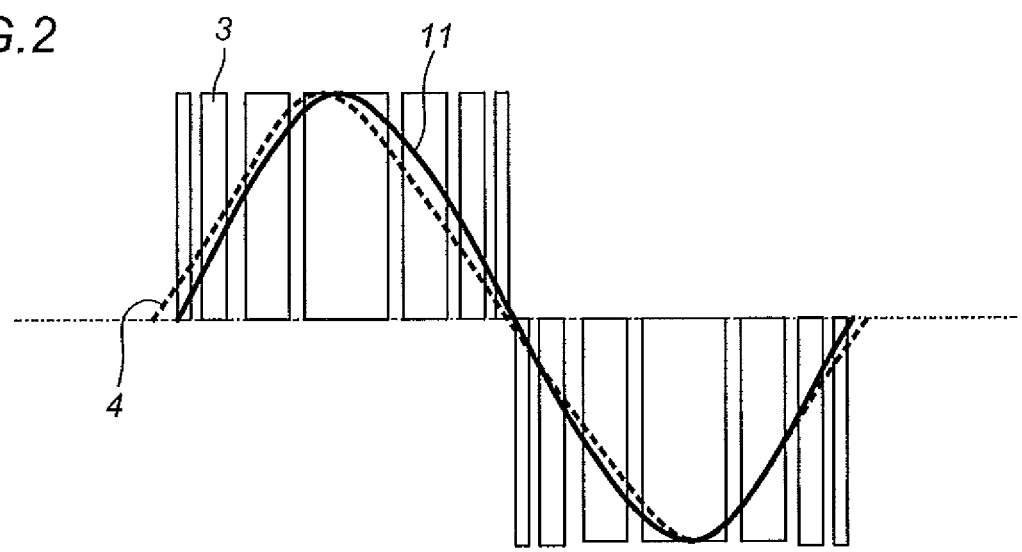
FIG. 2 shows a representation of the supply voltage and of the modulating wave signal extracted by the device of FIG. 1.

The numeral 1 in the drawings denotes a device for detecting (i.e. measuring) and processing signals relating to partial electrical discharges in an electrical apparatus 2 powered by a pulsed voltage, such as, for example, a square-wave voltage.

Although reference is made herein to a square-wave supply voltage, it is understood that this invention applies to all cases where the voltage applied to the apparatus being measured is a pulsed voltage with pulses of any shape and thus not necessarily square.

More specifically, the square wave is a wave modulated by a modulating wave in such a way as to form an alternating voltage of predetermined frequency (the frequency may be constant or variable, as in the case of drives), for example using a PWM modulation technique (for example, sinusoidal PWM) or stepped modulation.

In other words, the supply voltage of the apparatus 2 referred to in this document is any output wave from a static power converter.

In FIG. 1, the square power supply wave of the electrical apparatus 2 is denoted by the numeral 3 and the modulating wave by the numeral 4.

The device 1 comprises a sensor 5 (of per se known type such as, for example, an antenna, a resistive or capacitive divider or an electromagnetic coupler) connectable to the apparatus 2 to detect a discharge signal 6 representing the electric pulses generated by the partial discharges.

The device 1 also comprises a processing unit 7 connected to the sensor 5 to receive the discharge signal 6 and derive the detection instants of each of the pulses with respect to a predetermined time reference.

The processing unit 7 comprises, for example, a software driven oscilloscope or, more preferably, is made as described in patent document WO2007/144789 in the name of the same applicant as this invention.

It should be noted that if the sensor 5 comprises an antenna, the device 1 also preferably comprises a frequency shift element (not illustrated in the drawings) having an input connected to the sensor 5 to receive a signal detected by the latter, and an output connected to the processing unit 7.

The frequency shift element is configured to convert the signal detected by the antenna (having frequencies of at least 300 MHz) into a signal 6 having the same information content but defining frequencies in the 90 KHz-40 MHz range). This advantageously allows the signal 6 to be adapted to an input stage of the processing unit 7.

According to the invention, the device 1 comprises a synchronization module 8 designed to receive an electrical signal 9 representing the power supply voltage and equipped with a filter 10 configured for extracting from said power supply signal 9 a signal 11 representing the modulating wave 4.

The processing unit 7 is configured for associating with the pulses detected (contained in the discharge signal 6) the values of a phase parameter f representing the phase of the modulating wave 4 at the pulse detection instants.

It should be noted that speaking of the phase of the modulating wave 4 is based on the assumption that the modulating wave 4 forms a periodic signal, so that the phase of the wave is directly correlated with the effective value of the supply voltage applied to the electrical apparatus 2 being measured.

It should be noted that the numeral 12 denotes a power supply configured to apply that supply voltage (that is, the square-wave voltage modulated to form an alternating voltage) to the electrical apparatus 2 being measured; the power supply 12 comprises, for example, an inverter configured to operate in PWM mode.

The numeral 13 denotes a voltage divider connected across the power supply 12 and the filter 10. The voltage divider 13 receives as input the supply voltage and returns as output a voltage having the same waveform but a lower value, according to a technique well known in the trade.

It should be noted that the synchronization module 8 comprises an input stage 14 of the processing unit 7 designed to receive the synchronization signal 11.

The processing unit 7 is programmed to acquire a plurality of pulses detected in sequence and to generate a data set comprising, for each pulse of said plurality, the value of an amplitude parameter q correlated with the amplitude of the pulse detected, and the value of the phase parameter f.

It should be noted that a single acquisition entails acquiring a preset number of pulses (detected, i.e. extracted, from the discharge signal 6) or, alternatively, detecting the discharge signal 6 and acquiring corresponding pulses for a predetermined interval of time.

Preferably, the processing unit 7 is connected to an interface (not illustrated, consisting for example of a customary screen) to provide a representation of the data set in the form of a phase-amplitude pattern 15 (also known as PRPD pattern), where the pulses detected (in the acquisition) are represented by points in a reference system having a first axis assigned to the phase parameter f and a second axis assigned to the amplitude parameter q.

Figure 3:
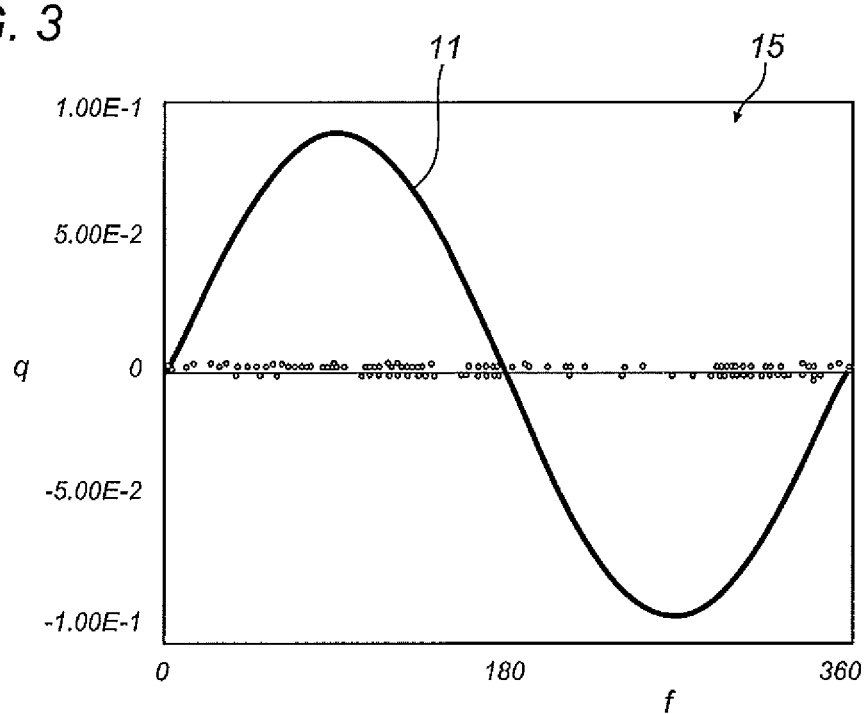
FIG. 3 shows a phase-amplitude pattern derived by the device of FIG. 1 in the presence of noise.
Figure 4:
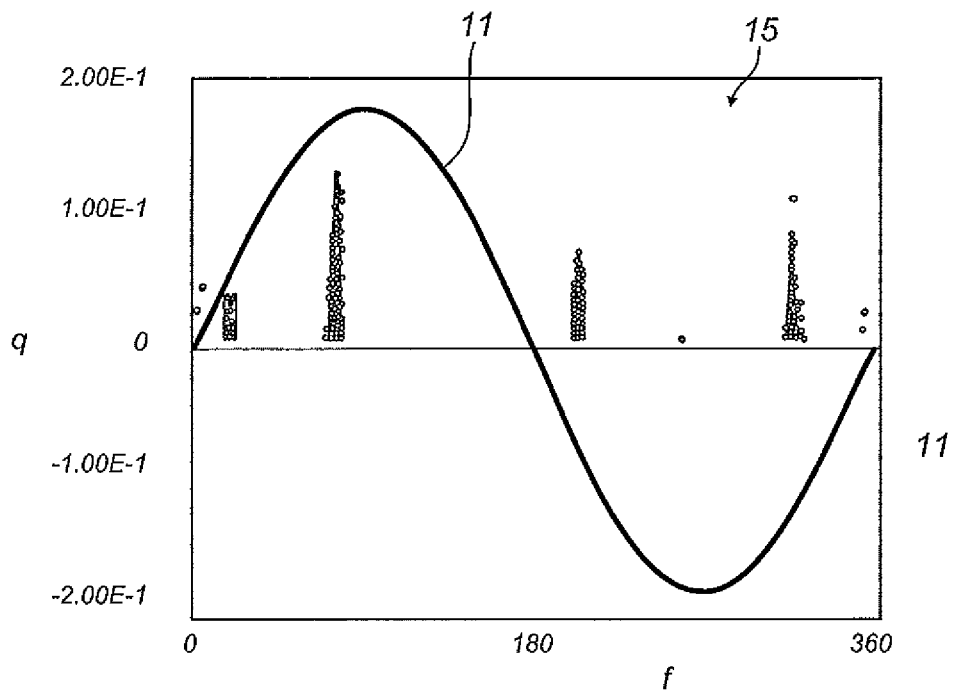
FIG. 4 illustrates the pattern of FIG. 3 in the presence of a partial discharge activity in the apparatus being measured.

FIGS. 3 and 4 show examples of phase-amplitude patterns for two different acquisitions. In these figures, the phase parameter f is expressed in degrees and the amplitude parameter q is expressed in V.

Preferably, the processing unit 7 is programmed to separate the data set (relating to the values of the phase f, and possibly also of the amplitude q, and defining a distribution of the phase parameter fi, and possibly also of the amplitude parameter q) into distinct groups of discharges concentrated in the same phase intervals, these groups defining peaks, that is, clusters, of distinct discharges in the phase distribution, that is, in the PRPD pattern.

Preferably, the processing unit 7 is programmed to derive, from the phase f values constituting the data set (and defining a distribution of the phase parameter fi), an indicator representing the number of discharge groups (concentrated in the same phase intervals). This indicator constitutes a statistical indicator usable for diagnostic purposes (for example, for processing by an identifier, by itself or together with other parameters, as described below).

It should be noted that this invention can also be applied to polyphase, in particular, three-phase, electrical machines (in particular, motors).

In light of this, preferably, the processing unit 7 is programmed to correlate a first data set, relating to the partial discharge measurements performed on one phase of the machine, with a second data set, relating to the partial discharge measurements performed on a different phase of the machine, the first and second data sets relating to partial discharges that occur in the same source (defect) as a function of a correlation of corresponding groups (that is to say, a group of the first data set is correlated with a group of the second data set) based on a match of the respective phase intervals.

This advantageously makes for good diagnostic effectiveness. In effect, among the various types of defects that may be found in an electrical machine powered by square-wave voltage, only some types (for example, insulation defects between one machine phase and another phase adjacent to it) generate pulses (that is, signals) which couple to more than one machine phase (and which are therefore observable on more than one machine phase).

Further, according to the invention, the processing unit 7 comprises an identification module configured to assess whether each of said pulses (that is, the pulses detected in one acquisition) is attributable to a partial discharge or not according to an analysis performed on the data set containing the pulse itself. This analysis is preferably an analysis of a statistical type.

Further, the identification module is configured to assess whether or not each of said pulses (that is, the pulses detected in one acquisition) is attributable to one predetermined type of partial discharge source, according to an analysis performed on the data set containing the pulse itself.

The identification module is defined by a software implemented in the processing unit 7.

More specifically, the processing unit 7 is programmed to calculate predetermined statistical indicators based on the data set constituted by the amplitude parameter q and the phase parameter f.

Below is a non-exhaustive example list of statistical indicators: mean value of the distribution of the phase parameter f values, minimum value of the distribution of the phase parameter f values, skewness (third order moment) of the distribution of the amplitude parameter q values, shape factor of the Weibull distribution which approximates the values of the amplitude parameter q.

Further, the identification module also defines two or more predetermined categories of sources that generate partial discharges. For example, the identification module is programmed to distinguish discharges that occur inside the insulation of the apparatus 2 from discharges that occur outside the insulation of the apparatus 2, in air.

The device 1 is connectable to a database containing reference values for the statistical indicators, these reference values being characteristic of the predetermined categories of the sources that generate partial discharges.

Preferably, the device 1 comprises a memory containing the database with the reference values for the statistical indicators, that is, the reference values characteristic of the predetermined categories of the sources that generate partial discharges.

In light of this, the identification module is programmed to attribute the data set detected (relating to the pulses of a single acquisition) to one or more of the source categories, based on the values of the statistical indicators calculated on the data of the data set.

According to another aspect of this invention, the identification module is configured to assess whether or not to attribute each of the pulses to a partial discharge, that is to say, to a partial discharge or to an impulsive disturbance or other signals captured by the sensor 5 and constituting noise.

This function of the identification module is known as noise rejection.

More specifically, the identification module is programmed to detect, using mathematical algorithms of substantially known type, whether one of the following two situations occurs.

In the first situation, the phase values relating to the data set (relating to a given acquisition) are distributed in substantially uniform manner along a predetermined phase interval (that is, the 0-360 degree interval corresponding to the period of the modulating wave 4).

In the second situation, the phase values relating to the data set (relating to a given acquisition) are concentrated, that is, grouped in one or more phase sub-intervals (constituting subsets of the 0-360 degree interval corresponding to the period of the modulating wave 4).

The identification module is programmed to attribute the signals detected to noise, that is, to activities extraneous to partial discharges in the measuring apparatus 2, when the identification module detects the first situation. An example of the first situation is shown in FIG. 3.

The identification module is programmed to attribute the signals detected to partial discharges when the identification module detects the second situation. An example of the second situation is shown in FIG. 4.

Thus, the invention also provides a method for detecting and processing signals relating to partial electrical discharges in an electrical apparatus 2 powered by a pulsed voltage, in particular a square-wave 3 voltage, modulated by a modulating wave 4 in such a way as to form an alternating voltage of predetermined frequency.

The method comprises the following steps:
- connecting a sensor 5 to the apparatus 2 for measuring a discharge signal 6 representing the electrical pulses generated by the partial discharges;
- deriving the detection instants of each of the pulses detected with respect to a predetermined time reference.

According to the invention, the method further comprises the following steps:
- extracting the modulating wave 4 (that is, a signal 11 representing the modulating wave 4) from an electrical signal 9 representing the supply voltage;
- associating the pulses detected with values of a phase parameter f representing the phase of the modulating wave 4 at the pulse detection instants.

The method also comprises the steps of:
- acquiring a plurality of pulses measured in sequence (in the manner described above in connection with the device 1);
- generating a data set comprising, for each pulse of said plurality, the value of an amplitude parameter q correlated with the amplitude of the pulse detected, and the value of the phase parameter f.

In light of this, the method preferably further comprises the following steps:
- analysing (for example by statistical analysis of) the data set relating to the plurality of pulses (detected in sequence during the acquisition);
- assessing whether each of the pulses is attributable to a partial discharge or not according to the analysis performed on the data set.

These steps are performed in the manner described above in connection with the device 1.

This step allows noise rejection; it also enables subsequent identification of a source of the detected signal.

In light of this, it should be noted that the method preferably comprises the following steps:
- preparing a database containing reference values of predetermined statistical indicators relating to a data set comprising said amplitude parameter q and phase parameter f, said reference values being characteristic of said predetermined categories of sources that generate partial discharges (as described above);
- comparing the data in the set measured during the acquisition with the data in the database in order to assign said data set to one or more of said source categories, thereby identifying the type of source that generates the partial discharges.

This invention offers the following advantages.

First of all, the invention allows particularly significant and reliable diagnostic assessments to be made on electrical apparatuses powered by a pulsed supply voltage (for example, a square-wave voltage modulated using a sinusoidal PWM technique) based on the detection and processing of partial discharge signals.

In effect, the invention makes it possible to assign phase parameter values to signals detected on an electrical apparatus 2 to which a pulsed voltage is applied, this phase parameter being very important for analysing the data collected.

Moreover, the invention allows these diagnostic assessments, based on partial discharge measurements (performed on apparatuses powered by a pulsed voltage) to be made in a particularly reliable and robust manner.

Indeed, the invention makes it possible to distinguish the signals related to partial discharges from those related to noise and to attribute the signals related to partial discharges to a preset source of the discharges (thereby allowing the type of source of the partial discharges to be identified).

The invention claimed is:

1. A device for detecting and processing signals relating to partial electrical discharges in an electrical apparatus powered by a square-wave voltage modulated by a modulating wave in such a way as to form an alternating voltage of predetermined frequency, comprising:
- a sensor connectable to the apparatus for detecting a discharge signal representing the electrical pulses generated by the partial discharges;
- a processing unit connected to the sensor to receive the discharge signal and derive the detection instants of each of the pulses detected with respect to a predetermined time reference, wherein the device comprises:
- a synchronization module, designed to receive an electrical synchronization signal representing the power supply voltage and equipped with a filter configured for extracting from said power supply signal a signal representing the modulating wave, wherein the synchronization signal received from the synchronization module has a first contribution, relative to a square-wave voltage, and a second contribution, relative to the modulating wave and providing an alternating signal at said predetermined frequency lower than the frequency of the square-wave voltage, wherein the filter is configured for extracting said second contribution at said predetermined frequency;
- a voltage divider connected across the power supply and the filter, wherein the processing unit is configured for associating with the pulses detected the values of a phase parameter representing the phase of the modulating wave at the pulse detection instants.

2. The device according to claim 1, wherein the processing unit is programmed to acquire a plurality of pulses detected in sequence and to generate a data set comprising, for each pulse of said plurality, the value of an amplitude parameter correlated with the amplitude of the pulse detected, and the value of the phase parameter.

3. The device according to claim 2, wherein the processing unit comprises an identification module adapted to assess whether each of said pulses is attributable to a partial discharge or not according to an analysis performed on the data set containing the pulse itself.

4. The device according to claim 3, wherein the identification module is programmed to evaluate whether the phase parameter values from an acquisition are distributed uniformly in a reference phase interval or grouped in one or more subsets of the reference interval.

5. The device according to claim 2, wherein the identification module is programmed to assign said detected data set, containing the pulses from a single acquisition, to one or more source categories, the device being connectable to a database containing reference values of predetermined statistical indicators relating to a data set comprising said amplitude parameter and phase parameter, said reference values being characteristic of said predetermined categories of sources that generate partial discharges.

6. The device according to claim 5, wherein the statistical indicators comprise the smallest value and the mean value of the distribution of the phase parameter for the data set and the skewness value of the distribution of the amplitude parameter for the data set.

7. A method for detecting and processing signals relating to partial electrical discharges in an electrical apparatus powered by a power supply with a square-wave voltage modulated by a modulating wave in such a way as to form an alternating voltage of predetermined frequency, the method comprising the following steps:
- connecting a sensor to the apparatus for measuring a discharge signal representing the electrical pulses generated by the partial discharges;
- deriving, at a processing unit connected to the sensor, the detection instants of each of the measured pulses relative to a predetermined time reference;

wherein it further comprises the following steps:
- providing a filter and voltage divider connected across the power supply and the filter;
- receiving at the filter a synchronization signal representing the power supply voltage and having a first contribution, relative to a square-wave voltage, and a second contribution, relative to the modulating wave and providing an alternating signal of predetermined frequency lower than the frequency of the square-wave voltage,
- extracting the modulating wave from said electrical synchronization signal, through an extraction at the filter of said second contribution at said predetermined frequency;
- associating the measured pulses with values of a phase parameter representing the phase of the modulating wave at the pulse detection instants.

8. The method according to claim 7, further comprising the following steps:
- acquiring a plurality of pulses detected in sequence;
- generating a data set comprising, for each pulse of said plurality, the value of an amplitude parameter correlated to the amplitude of the pulse measured, and the value of the phase parameter.

9. The method according to claim 8, further comprising the following steps:
- analysing the data set relating to said plurality of pulses;
- assessing whether each of said pulses is attributable to a partial discharge or not according to an analysis performed on the data set in order to identify a source of the measured signal.

10. The method according to claim 8, further comprising the following steps:
- preparing a database containing reference values of predetermined statistical indicators relating to a data set comprising said amplitude parameters and phase parameters, said reference values being characteristic of said predetermined categories of sources that generate partial discharges;
- comparing the data in the set detected during the acquisition with the data in the database in order to assign said data set to one or more of said source categories, thereby identifying the type of source that generates the partial discharges.

* * * * *